United States Patent [19]

Palmquist et al.

[11] 4,434,488
[45] Feb. 28, 1984

[54] LOGIC ANALYZER FOR A MULTIPLEXED DIGITAL BUS

[75] Inventors: Steven R. Palmquist, Beaverton; David D. Chapman, Portland; Gerd H. Hoeren, Lake Oswego, all of Oreg.

[73] Assignee: Tektronix, Inc., Beaverton, Oreg.

[21] Appl. No.: 271,345

[22] Filed: Jun. 8, 1981

[51] Int. Cl.³ .............................................. G09G 1/08
[52] U.S. Cl. .................................. 371/15; 324/73 R; 340/721; 340/801; 340/802; 364/900; 371/29
[58] Field of Search ................ 371/15, 16, 20, 29; 324/73 R, 73 AT, 121 R; 340/717, 721, 731, 801, 802; 364/521, 900

[56] References Cited

U.S. PATENT DOCUMENTS

| | | | |
|---|---|---|---|
| 3,522,597 | 8/1970 | Murphy | 340/722 |
| 4,139,903 | 2/1979 | Morrill, Jr. et al. | 364/900 |
| 4,204,114 | 5/1980 | Shoemaker et al. | 371/20 |
| 4,257,043 | 3/1981 | Tsuchiko | 340/721 |
| 4,308,615 | 12/1981 | Koegil et al. | 371/20 |
| 4,354,260 | 10/1982 | Planzo | 340/802 |
| 4,364,036 | 12/1982 | Shimizu | 340/121 R |

OTHER PUBLICATIONS

Farnbach, Logic State Analyzers-A New Instrument for Analyzing Sequential Digital Processes, IEEE Transactions on Instrumentation and Measurement, vol. IM-24, No. 4, Dec. 1975, pp. 353-356.

*Primary Examiner*—Charles E. Atkinson
*Attorney, Agent, or Firm*—George T. Noe

[57] ABSTRACT

A logic analyzer for measuring individually a plurality of logic signals transmitted via a multiplexed digital bus in a time-sharing manner is disclosed. First and second memory circuits store respectively first and second logic signals of the multiplexed digital bus in accordance with first and second strobe signals synchronized with the first and second logic signals.

6 Claims, 3 Drawing Figures

```
STATE TABLE DISPLAY

A      B
SEQ     HEX    HEX 526     00     37
527     01     A9
528     02     0B
529     03     54
530     04     3E
531     05     E5
532     06     13
533     07     7A
534     08     B6
535     09     C0
536     00     91
537     0A     2C
538     0B     68
539     0C     30
540     0D     42
541     0E     09
```

LOGIC ANALYZER FOR A MULTIPLEXED DIGITAL BUS

CROSS REFERENCE TO RELATED APPLICATION

This application is related to co-pending application Ser. No. 271,347, filed June 8, 1981, entitled "Multispeed logic analyzer".

BACKGROUND OF THE INVENTION

The present invention relates to a logic analyzer for measuring a plurality of logic signals transmitted through a single digital bus in time-sharing manner.

It is becoming a common practice to incorporate microprocessors into digital electronic apparatus to provide intelligent functions. For developing, calibrating, and troubleshooting such electronic apparatus, powerful logic measurement instruments are necessary. One logic measurement instrument is a logic analyzer comprising a memory circuit for storing input logic signals, a word recognizer for recognizing a predetermined trigger word from the input logic signals, a display device for displaying the stored signals in the memory circuit and a controller. The logic analyzer is a very useful and versatile tool because it can measure multiple-bit logic data such as 4, 8, 16 or 32 bits of data and can measure the desired portion of the input data before and/or after the predetermined trigger word in the input data.

In some microprocessor systems, signal groups such as data and address signals are transmitted through a multiplexed digital bus in a time-sharing manner. Since conventional logic analyzers include one memory circuit for each input channel and each memory circuit receives the same clock pulse, the memory circuits store the data and address signals alternately. The display device displays the stored signals in the memory circuits in the order of the memory address, i.e., the data and address signals are displayed alternately. Hence, a confusing display results and an operator must mentally keep track of what is being observed.

Moreover, many communication systems use the time-sharing digital transmission systems. If the conventional logic analyzers are used for measuring these systems, there is the same problem described hereinbefore.

SUMMARY OF THE INVENTION

According to the present invention, the logic signals transmitted in the time-sharing manner are distinguished and stored in a plurality of memory circuits in accordance with designated groups of logic signals. Each memory circuit corresponds to a particular group, e.g., a first memory circuit stores only address signals and a second memory circuit stores only data signals. To distinguish the groups of input signals in the multiplexed digital bus, strobe signals are used as clock pulses for input latches such as registers. The stored signals in the plurality of memory circuits are simultaneously read out to display them in parallel.

In addition, the present invention includes a plurality of word recognizers, one for each of the input logic signals, so that a complex combination of trigger words is available for determining a trigger point.

It is therefore one object of the present invention to provide a novel logic analyzer which easily measures a plurality of logic signals transmitted through a multiplexed digital bus in a time-sharing manner.

It is another object to provide a logic analyzer which distinguishes groups of the logic signals transmitted through the multiplexed digital bus.

It is a further object to provide a logic analyzer having a plurality of memory circuits for each group of the logic signals transmitted through the multiplexed digital bus.

It is an additional object to provide a logic analyzer which displays the logic signals distinctly in accordance with the groups thereof, wherein the logic signals are transmitted in a time-sharing manner.

It is another object to provide a logic analyzer including a plurality of word recognizers for each group of logic signals transmitted in time-sharing manner.

This invention is pointed out with particularity in the appended claims. Other objects and advantages of this invention will become apparent to those having ordinary skill in the art when taken in conjunction with the accompanying drawings.

DRAWINGS

DETAILED DESCRIPTION OF THE INVENTION

Figure 1:
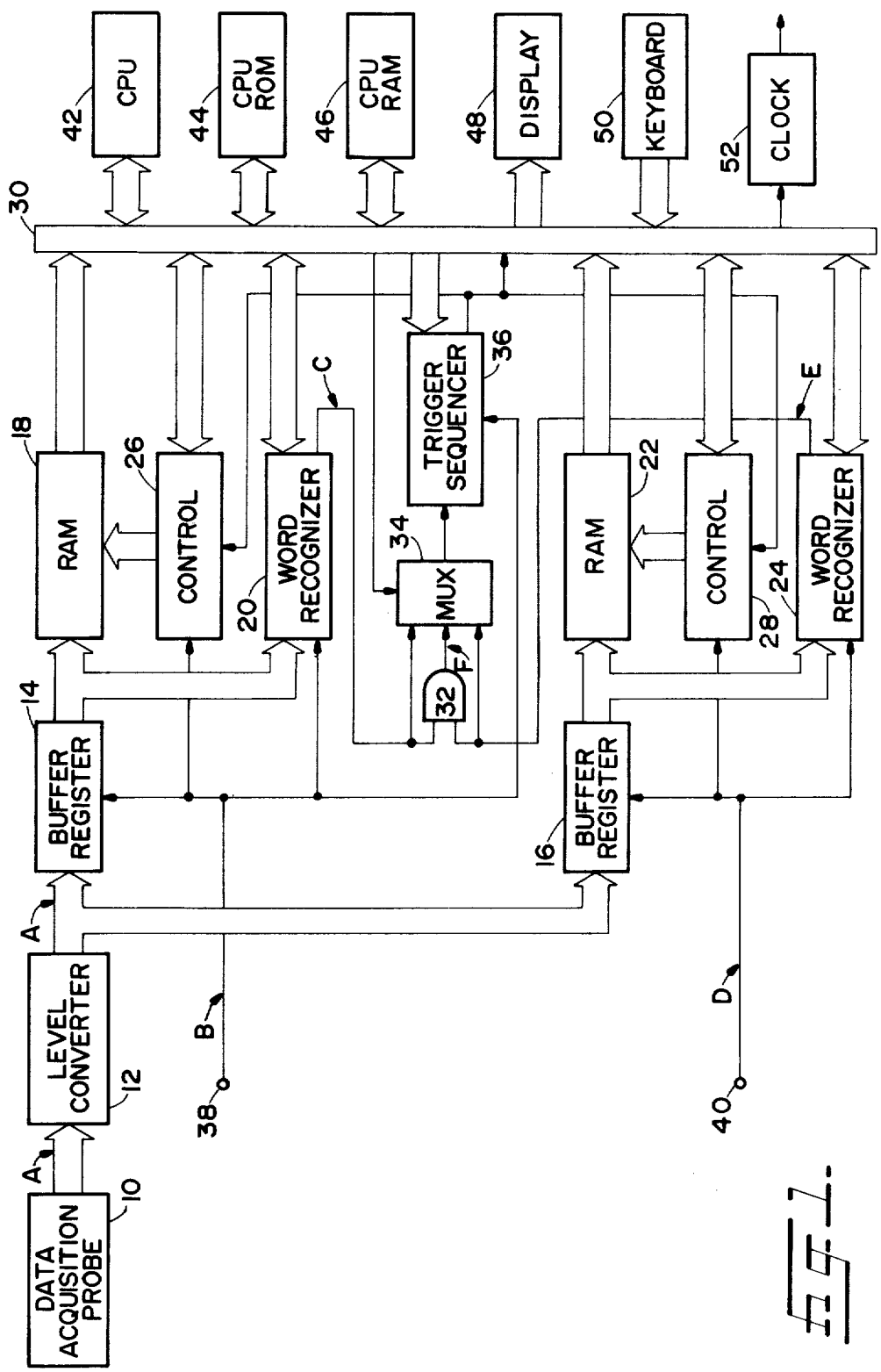
FIG. 1 is a block diagram of one preferred embodiment according to the present invention.

Turning now to the drawings, there is shown in FIG. 1 a block diagram of one embodiment according to the present invention. Data acquisition probe 10 acquires logic information such as eight-bit logic signals to be measured, and transfers it to level converter 12 for converting an input logic level to the predetermined logic level such as TTL level used in FIG. 1. The converted logic signals are applied to buffer registers 14 and 16 operating as latches. The output from buffer register 14 is applied to a memory circuit such as Random Access Memory (RAM) 18 and word recognizer 20. Similarly, the output from buffer register 16 is applied to RAM 22 and word recognizer 24. Control circuits 26 and 28 include address counters for determining the memory addresses of RAM's 18 and 22, and control the write/read mode of RAM's 18 and 22. Control circuits 26 and 28 receive the write/read instruction signals from bus 30 including data, address and control buses, and apply the address information to bus 30. Read-out signals from RAM's 18 and 22 are applied to bus 30.

Word recognizers 20 and 24 detect the desired trigger words from the outputs of buffer registers 14 and 16, and apply output pulses to bus 30, AND gate 32 and multiplexer 34. The desired trigger words are set by instructions from bus 30. Multiplexer 34 selects the outputs from word recognizers 20 and 24 and AND gate 32 in accordance with an instruction from bus 30, and applies the output to trigger sequencer 36. A pulse signal at terminal 38 is applied to the clock terminals of buffer register 14, word recognizer 20, control circuit 26 and trigger sequencer 36. A pulse signal at terminal 40 is applied to the clock terminals of buffer register 16, word recognizer 24 and control circuit 28. Trigger sequencer 36 includes a programmable counter which starts to count the pulse from terminal 38 when multiplexer 34 generates the output. When the counter counts the desired number of pulses set by an instruction from main bus 30, trigger sequencer 36 applies a stop signal to bus 30 and control circuits 26 and 28 to stop the write mode of RAM's 18 and 22. According to trigger sequencer 36, the trigger point can be selected as any of the following: pre-trigger (storing the logic signals before the trigger word), center-trigger (storing the logic signals before and after the trigger word) or post-trigger (storing the logic signals after the trigger word).

Main bus 30 is connected to Central Processing Unit (CPU) 42 such as a microprocessor, CPU Read Only Memory (ROM) 44 containing firmware and CPU RAM 46 acting as a temporary memory of CPU 42. These blocks 42, 44 and 46 comprise a controller of the logic analyzer of FIG. 1. Display device 48 is, for example, a cathode-ray tube for displaying the stored logic signals in RAM's 18 and 22 as well as other information. Keyboard 50 is connected to bus 30 for setting the trigger words, the trigger position, multiplexer 34 or the like. Internal clock generator 52 generates a clock signal the frequency of which is determined by an instruction from bus 30. The clock is applied to blocks 26, 28 and 42 through 50 (connection lines are not shown).

Figures 2, 3:
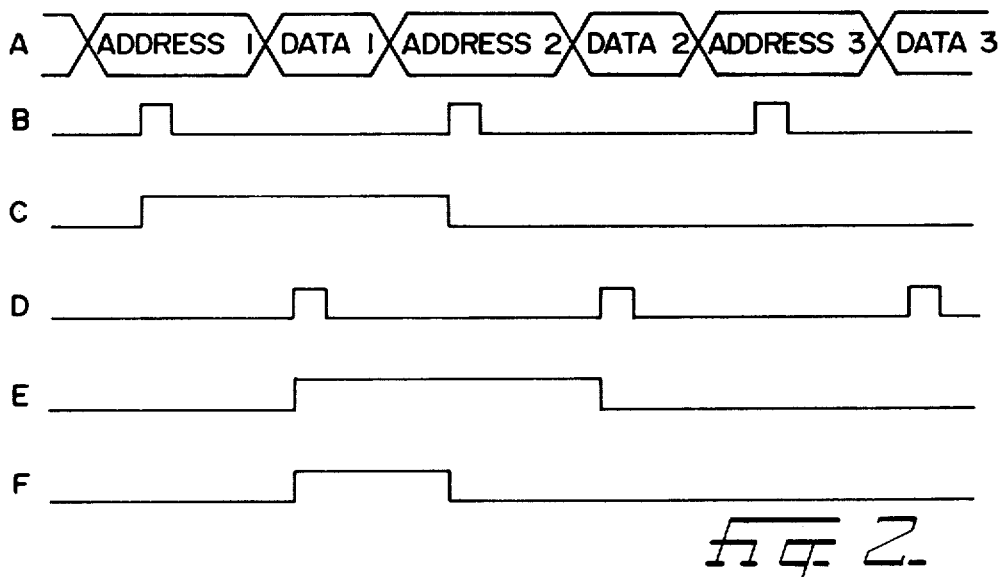
FIG. 2 is a timing diagram for explaining the operation of FIG. 1.
FIG. 3 is a display of a display device in FIG. 1 for explaining the operation of FIG. 1.

The operation of the present invention will be discussed by reference to FIGS. 2 and 3. In FIG. 2, A is an eight-bit logic signal transmitted via a multiplexed digital bus of a microcomputer system under test wherein address and data signals are transmitted alternately, and B and D are respectively address and data strobes of the microcomputer system. The probe tips (not shown) of data acquisition probe 10 are connected to the multiplexed digital bus for acquiring digital signals A. Connectors 38 and 40 receive address and data strobes B and D respectively. Acquired logic signals A are applied through level converter 12 to buffer registers 14 and 16. Since buffer register 14 receives address strobe B as the clock signal, register 14 samples only the address component of logic signals A. Similarly, buffer register 16 samples only the data component of logic signals A in response to the data strobe D. The address counter of control circuit 26 counts address strobes to determine the address of RAM 18 which stores the address component of logic signals A. RAM 22 stores the data component of logic signals A in accordance with the output from the address counter of control circuit 28 which counts data strobes D.

If word recognizer 20 is set to detect "Address 1" of logic signals A as the trigger word by CPU 42 and keyboard 50, word recognizer 20 generates output pulse C. If keyboard 50 sets via CPU 42 word recognizer 24 to detect "Data 1" of logic signals A, word recognizer 24 generates output pulse E. The output from AND gate 32 is pulse F. Multiplexer 34 selects one of pulses C, E and F in accordance with the instruction from keyboard 50 via CPU 42. When trigger sequencer 36 receives the output from multiplexer 34, it starts to count address strobe B until the predetermined number set by keyboard 50 is reached.

When trigger sequencer 36 generates the stop signal, control circuits 26 and 28 stop the write mode of RAM's 18 and 22. In the read mode, the stored logic signals in RAM's 18 and 22 are read out sequentially in accordance with the address signals from the counters of control circuits 26 and 28 which count the clock from clock generator 52. The read out signals are displayed on display device 48 as a timing diagram or a state table. It should be noted that the address and data components of logic signals A are individually displayed. If the state display mode is selected, the read out signals from RAM's 18 and 22 are converted into the desired number system such as binary, octal or hexadecimal by CPU 42 and the firmware in ROM 44. One example of the display is shown in FIG. 3. In the display, "A" and "B" indicate RAM's 18 and 22 (the address and data components) respectively. "SEQ" indicates the address numbers of RAM's 18 and 22. "HEX" means "hexadecimal". Since the address and data components are shown in parallel, it is easy for the operator to observe.

RAM 46 stores the setting information such as the trigger words, the trigger point, etc., and the information can be displayed. As can be understood, the above operations are controlled by CPU 42 and the firmware in ROM 44.

While we have shown and described herein the preferred embodiment of our invention, it will be apparent to those skilled in the art that many changes and modifications may be made without departing from our invention in its broader aspects. For example, more combinations of the buffer register, RAM, control circuit and word recognizer may be added.

What we claim as being novel is:

1. A logic analyzer for measuring first and second logic signals transmitted in a time-sharing manner, comprising:
    single input means for receiving both said first and second logic signals in sequence;
    first memory means coupled to said input means for storing only said first logic signal in accordance with a first strobe signal synchronized with said first logic signal;
    second memory means coupled to said input means for storing only said second logic signal in accordance with a second strobe signal synchronized with said second logic signal; and
    control means for controlling write and read operating modes and selection of memory addresses of said first and second memory means.

2. A logic analyzer according to claim 1 further including a display device for displaying the stored signals in said first and second memory means individually.

3. A logic analyzer according to claim 1 further including first and second word recognizers coupled to said input means for detecting selected trigger words from said first and second logic signals, respectively.

4. A logic analyzer according to claim 1 wherein each of said first and second memory means comprises a buffer register for sampling said first or second logic signal in accordance with said first or second strobe signal, and a random access memory for storing the output from said buffer register.

5. A logic analyzer according to claim 1 wherein said control means includes counters counting said strobe signals for generating address signals for both said first and second memory means.

6. A logic analyzer according to claim 3 further including a trigger sequencer for determining a trigger point to stop the write mode of said memory means in accordance with the outputs from said word recognizers.

* * * * *